(12) United States Patent
Maxwell (10) Patent No.: US 8,765,566 B2
(45) Date of Patent: Jul. 1, 2014

(54) LINE AND SPACE ARCHITECTURE FOR A NON-VOLATILE MEMORY DEVICE

(75) Inventor: Steven Patrick Maxwell, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 66 days.

(21) Appl. No.: 13/468,201

(22) Filed: May 10, 2012

(65) Prior Publication Data

US 2013/0299769 A1 Nov. 14, 2013

(51) Int. Cl.
*G11C 11/22* (2006.01)

(52) U.S. Cl.
USPC ............. 438/382; 365/148; 365/72; 365/100; 365/115; 365/163; 438/238; 257/5; 257/E21.663; 257/E27.006; 257/E47.005

(58) Field of Classification Search
USPC ................ 365/72, 148, 175; 438/3, 238, 382; 257/5
See application file for complete search history.

(56) References Cited

U.S. PATENT DOCUMENTS

| 680,652 A | 8/1901 | Elden |
|---|---|---|
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |

(Continued)

FOREIGN PATENT DOCUMENTS

| KR | 1020110014248 A | 2/2011 |
|---|---|---|
| WO | WO 03/034498 A1 | 4/2003 |
| WO | WO 2009/005699 A1 | 1/2009 |

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Ori Nadav
*Assistant Examiner* — Ernest Allen, III
(74) *Attorney, Agent, or Firm* — Ogawa P.C.

(57) ABSTRACT

A non-volatile memory device includes first wiring structures elongated in a first direction and separated by a first gap region in a second direction, the first gap region comprising first dielectric material formed in a first process, second wiring structures elongated in a second direction and separated by a second gap region in a first direction, the second gap region comprising second dielectric material formed in a second process, and a resistive switching devices comprising active conductive material, resistive switching material, and a junction material, wherein resistive switching devices are formed at intersections of the first wiring structures and the second wiring structures, wherein the junction material comprising p+ polysilicon material overlying the first wiring material, wherein some resistive switching devices are separated by the first gap region and some resistive switching devices separated by the second gap region.

9 Claims, 7 Drawing Sheets

(56) References Cited

U.S. PATENT DOCUMENTS

| | | | |
|---|---|---|---|
| 5,645,628 | A | 7/1997 | Endo et al. |
| 5,707,487 | A | 1/1998 | Hori et al. |
| 5,714,416 | A | 2/1998 | Eichman et al. |
| 5,751,012 | A | 5/1998 | Wolstenholme et al. |
| 5,840,608 | A | 11/1998 | Chang |
| 5,970,332 | A | 10/1999 | Pruijmboom et al. |
| 5,998,244 | A | 12/1999 | Wolstenholme et al. |
| 6,128,214 | A | 10/2000 | Kuekes et al. |
| 6,143,642 | A | 11/2000 | Sur, Jr. et al. |
| 6,259,116 | B1 | 7/2001 | Shannon |
| 6,291,836 | B1 | 9/2001 | Kramer et al. |
| 6,436,765 | B1 | 8/2002 | Liou et al. |
| 6,436,818 | B1 | 8/2002 | Hu et al. |
| 6,492,694 | B2 | 12/2002 | Noble et al. |
| 6,627,530 | B2 | 9/2003 | Li et al. |
| 6,762,474 | B1 | 7/2004 | Mills, Jr. |
| 6,768,157 | B2 | 7/2004 | Krieger et al. |
| 6,815,286 | B2 | 11/2004 | Krieger et al. |
| 6,838,720 | B2 | 1/2005 | Krieger et al. |
| 6,858,481 | B2 | 2/2005 | Krieger et al. |
| 6,858,482 | B2 | 2/2005 | Gilton |
| 6,864,127 | B2 | 3/2005 | Yamazaki et al. |
| 6,864,522 | B2 | 3/2005 | Krieger et al. |
| 6,881,994 | B2 | 4/2005 | Lee et al. |
| 6,927,430 | B2 | 8/2005 | Hsu |
| 6,939,787 | B2 | 9/2005 | Ohtake et al. |
| 6,946,719 | B2 | 9/2005 | Petti et al. |
| 7,020,006 | B2 | 3/2006 | Chevallier et al. |
| 7,023,093 | B2 | 4/2006 | Canaperi et al. |
| 7,026,702 | B2 | 4/2006 | Krieger et al. |
| 7,102,150 | B2 | 9/2006 | Harshfield et al. |
| 7,122,853 | B1 | 10/2006 | Gaun et al. |
| 7,187,577 | B1 | 3/2007 | Wang et al. |
| 7,221,599 | B1 | 5/2007 | Gaun et al. |
| 7,238,607 | B2 | 7/2007 | Dunton et al. |
| 7,254,053 | B2 | 8/2007 | Krieger et al. |
| 7,289,353 | B2 | 10/2007 | Spitzer et al. |
| 7,324,363 | B2 | 1/2008 | Kerns et al. |
| 7,365,411 | B2 | 4/2008 | Campbell |
| 7,405,418 | B2 | 7/2008 | Happ et al. |
| 7,426,128 | B2 | 9/2008 | Scheuerlein |
| 7,433,253 | B2 | 10/2008 | Gogl et al. |
| 7,474,000 | B2 | 1/2009 | Scheuerlein et al. |
| 7,479,650 | B2 | 1/2009 | Gilton |
| 7,499,355 | B2 | 3/2009 | Scheuerlein et al. |
| 7,521,705 | B2 | 4/2009 | Liu |
| 7,534,625 | B2 | 5/2009 | Karpov et al. |
| 7,541,252 | B2 | 6/2009 | Eun et al. |
| 7,550,380 | B2 | 6/2009 | Elkins et al. |
| 7,566,643 | B2 | 7/2009 | Czubatyi et al. |
| 7,606,059 | B2 | 10/2009 | Toda |
| 7,615,439 | B1 | 11/2009 | Schricker et al. |
| 7,629,198 | B2 | 12/2009 | Kumar et al. |
| 7,719,001 | B2 | 5/2010 | Nomura et al. |
| 7,728,318 | B2 | 6/2010 | Raghuram et al. |
| 7,729,158 | B2 | 6/2010 | Toda et al. |
| 7,749,805 | B2 | 7/2010 | Pinnow et al. |
| 7,772,581 | B2 | 8/2010 | Lung |
| 7,778,063 | B2 | 8/2010 | Brubaker et al. |
| 7,786,464 | B2 | 8/2010 | Nirschl et al. |
| 7,786,589 | B2 | 8/2010 | Matsunaga et al. |
| 7,824,956 | B2 | 11/2010 | Schricker et al. |
| 7,829,875 | B2 | 11/2010 | Scheuerlein |
| 7,835,170 | B2 | 11/2010 | Bertin et al. |
| 7,858,468 | B2 | 12/2010 | Liu et al. |
| 7,859,884 | B2 | 12/2010 | Scheuerlein |
| 7,875,871 | B2 | 1/2011 | Kumar et al. |
| 7,881,097 | B2 | 2/2011 | Hosomi et al. |
| 7,897,953 | B2 | 3/2011 | Liu |
| 7,898,838 | B2 | 3/2011 | Chen et al. |
| 7,920,412 | B2 | 4/2011 | Hosotani et al. |
| 7,924,138 | B2 | 4/2011 | Kinoshita et al. |
| 7,968,419 | B2 | 6/2011 | Li et al. |
| 7,972,897 | B2 | 7/2011 | Kumar et al. |
| 8,004,882 | B2 | 8/2011 | Katti et al. |
| 8,018,760 | B2 | 9/2011 | Muraoka et al. |
| 8,021,897 | B2 | 9/2011 | Sills et al. |
| 8,045,364 | B2 | 10/2011 | Schloss et al. |
| 8,054,674 | B2 | 11/2011 | Tamai et al. |
| 8,067,815 | B2 | 11/2011 | Chien et al. |
| 8,071,972 | B2 | 12/2011 | Lu et al. |
| 8,084,830 | B2 | 12/2011 | Kanno et al. |
| 8,088,688 | B1 | 1/2012 | Herner |
| 8,097,874 | B2 | 1/2012 | Venkatasamy et al. |
| 8,102,698 | B2 | 1/2012 | Scheuerlein |
| 8,143,092 | B2 | 3/2012 | Kumar et al. |
| 8,144,498 | B2 | 3/2012 | Kumar et al. |
| 8,164,948 | B2 | 4/2012 | Katti et al. |
| 8,168,506 | B2 | 5/2012 | Herner |
| 8,183,553 | B2 | 5/2012 | Phatak et al. |
| 8,207,064 | B2 | 6/2012 | Bandyopadhyay et al. |
| 8,227,787 | B2 | 7/2012 | Kumar et al. |
| 8,233,308 | B2 | 7/2012 | Schricker et al. |
| 8,237,146 | B2 | 8/2012 | Kreupl et al. |
| 8,374,018 | B2 | 2/2013 | Lu |
| 8,385,100 | B2 | 2/2013 | Kau et al. |
| 8,389,971 | B2 | 3/2013 | Chen et al. |
| 8,394,670 | B2 | 3/2013 | Herner |
| 8,399,307 | B2 | 3/2013 | Herner |
| 8,467,227 | B1 | 6/2013 | Jo |
| 8,658,476 | B1 | 2/2014 | Sun et al. |
| 8,659,003 | B2 | 2/2014 | Herner et al. |
| 2003/0052330 | A1 | 3/2003 | Klein |
| 2003/0141565 | A1 | 7/2003 | Hirose et al. |
| 2004/0026682 | A1 | 2/2004 | Jiang |
| 2004/0170040 | A1 | 9/2004 | Rinerson et al. |
| 2004/0192006 | A1 | 9/2004 | Campbell et al. |
| 2004/0194340 | A1 | 10/2004 | Kobayashi |
| 2005/0020510 | A1 | 1/2005 | Benedict |
| 2005/0029587 | A1 | 2/2005 | Harshfield |
| 2005/0062045 | A1 | 3/2005 | Bhattacharyya |
| 2006/0017488 | A1 | 1/2006 | Hsu |
| 2006/0281244 | A1 | 12/2006 | Ichige et al. |
| 2007/0008773 | A1* | 1/2007 | Scheuerlein .................. 365/161 |
| 2007/0015348 | A1 | 1/2007 | Hsu et al. |
| 2007/0045615 | A1 | 3/2007 | Cho et al. |
| 2007/0087508 | A1 | 4/2007 | Herner |
| 2007/0090425 | A1 | 4/2007 | Kumar et al. |
| 2007/0105284 | A1* | 5/2007 | Herner .......................... 438/131 |
| 2007/0105390 | A1 | 5/2007 | Oh |
| 2007/0205510 | A1 | 9/2007 | Lavoie et al. |
| 2007/0228414 | A1 | 10/2007 | Kumar et al. |
| 2007/0284575 | A1 | 12/2007 | Li et al. |
| 2007/0290186 | A1 | 12/2007 | Bourim et al. |
| 2007/0291527 | A1 | 12/2007 | Tsushima et al. |
| 2008/0002481 | A1 | 1/2008 | Gogl et al. |
| 2008/0006907 | A1 | 1/2008 | Lee et al. |
| 2008/0048164 | A1 | 2/2008 | Odagawa |
| 2008/0089110 | A1 | 4/2008 | Robinett et al. |
| 2008/0090337 | A1 | 4/2008 | Williams |
| 2008/0106925 | A1 | 5/2008 | Paz de Araujo et al. |
| 2008/0106926 | A1 | 5/2008 | Brubaker et al. |
| 2008/0185567 | A1 | 8/2008 | Kumar et al. |
| 2008/0206931 | A1 | 8/2008 | Breuil et al. |
| 2008/0220601 | A1 | 9/2008 | Kumar et al. |
| 2008/0232160 | A1 | 9/2008 | Gopalakrishnan |
| 2008/0278990 | A1 | 11/2008 | Kumar et al. |
| 2008/0304312 | A1 | 12/2008 | Ho et al. |
| 2008/0311722 | A1 | 12/2008 | Petti et al. |
| 2009/0001345 | A1 | 1/2009 | Schricker et al. |
| 2009/0014707 | A1 | 1/2009 | Lu et al. |
| 2009/0052226 | A1 | 2/2009 | Lee et al. |
| 2009/0095951 | A1 | 4/2009 | Kostylev et al. |
| 2009/0152737 | A1 | 6/2009 | Harshfield |
| 2009/0168486 | A1 | 7/2009 | Kumar |
| 2009/0231910 | A1 | 9/2009 | Liu et al. |
| 2009/0250787 | A1 | 10/2009 | Kutsunai |
| 2009/0256130 | A1 | 10/2009 | Schricker |
| 2009/0257265 | A1 | 10/2009 | Chen et al. |
| 2009/0267047 | A1 | 10/2009 | Sasago et al. |
| 2009/0298224 | A1 | 12/2009 | Lowrey |
| 2009/0321789 | A1 | 12/2009 | Wang et al. |
| 2010/0007937 | A1 | 1/2010 | Widjaja et al. |
| 2010/0012914 | A1 | 1/2010 | Xu et al. |

(56) References Cited

U.S. PATENT DOCUMENTS

| | | |
|---|---|---|
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0044708 A1 | 2/2010 | Lin et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0074374 A1 | 3/2012 | Jo |
| 2012/0080798 A1 | 4/2012 | Harshfield |
| 2012/0104351 A1 | 5/2012 | Wei et al. |
| 2012/0108030 A1 | 5/2012 | Herner |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0250183 A1 | 10/2012 | Tamaoka et al. |
| 2012/0305874 A1 | 12/2012 | Herner |
| 2012/0326265 A1 | 12/2012 | Lai et al. |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60,1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

(56) References Cited

OTHER PUBLICATIONS

Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9$^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.

(56) References Cited

OTHER PUBLICATIONS

Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Notice of Allowance for U.S. Appl. No. 12/833,989 dated May 30, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Shong Yin, "Solution Processed Silver Sulfide Thin Films for Filament Memory Applications", Technical Report No. UCN/EECS-2010-166, http://www.eecs.berkeley.edu/Pubs/TechRpts/2010/EECS-2010-166.html, Dec. 17. 2010, Electrical Engineering and Computer Sciences, University of California at Berkeley.
Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Office Action of U.S. Appl. No. 13/436,714 dated Dec. 7, 2012.
Office Action for U.S. Appl. No. 13/564,639, dated Mar. 19, 2013.
John S. Suehle et al. "Temperature Dependence of soft breakdown and wear-out in sub-3nm $SiO_2$ films", IEEE 38th Annual International Reliability Physics Symposium, 2000, pp. 33-34, San Jose, California.
Woonki Shin et al. "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036 dated Jul. 9, 2013.
Office Action for U.S. Appl. No. 13/764,698 dated Jul. 11, 2013.
Office Action for U.S. Appl. No. 13/481,600 dated Sep. 20, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.

\* cited by examiner

LINE AND SPACE ARCHITECTURE FOR A NON-VOLATILE MEMORY DEVICE

BACKGROUND

The present invention is generally related to resistive switching devices. More particularly, embodiments according to the present invention provide a method and a structure to form a resistive switching device. Embodiments according to the present invention can be applied to non-volatile memory devices but it should be recognized that the present invention can have a much broader range of applicability.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, a new semiconductor device structure and integration is desirable.

BRIEF SUMMARY OF THE PRESENT INVENTION

The present invention is generally related to resistive switching devices. More particularly, embodiments according to the present invention provide a method and a structure to form a resistive switching device. Embodiments according to the present invention can be applied to non-volatile memory devices but it should be recognized that the present invention can have a much broader range of applicability.

In various embodiments, resistive random accessed memory device (commonly known as RRAM or ReRAM) configured in a crossbar array has an unique advantage of forming a high density memory device. Each of the RRAM comprises of a top electrode, a bottom electrode, and a resistive switching material formed in between the first electrode and the second electrode. The resistive switching material is characterized by a resistance depending on an electric field applied to the electrodes. For a small feature size, the resistive switching element preferably has a small size as permitted by current patterning and etching techniques. Lithography to print such a small feature for etching is difficult and usually results in defects and yield loss. Additionally, RRAM device may use non-conventional materials not normally used in CMOS process and may complicate the CMOS fabrication process. Accordingly, embodiments according to the present invention provide a method and a device structure to form a resistive switching device using an amorphous silicon material as the resistive switching material.

In various embodiments, resistive random accessed memory device (commonly known as RRAM or ReRAM) configured in a crossbar array has an unique advantage of forming a high density memory device. Each of the RRAM comprises of a top electrode, a bottom electrode, and a resistive switching material formed in between the first electrode and the second electrode. The resistive switching material is characterized by a resistance depending on an electric field applied to the electrodes. For a small feature size, the resistive switching element preferably has a small size as permitted by current patterning and etching techniques. Lithography to print such a small feature for etching is difficult and usually results in defects and yield loss. Additionally, RRAM device may use non-conventional materials not normally used in CMOS process and may complicate the CMOS fabrication process. Accordingly, embodiments according to the present invention provide a method and a device structure to form a resistive switching device using an amorphous silicon material as the resistive switching material.

In a specific embodiment, a method of forming a non-volatile memory device is provided. The method includes providing a substrate having a surface region. A first dielectric material is formed overlying the surface region of the substrate and a first wiring material overlying the first dielectric material. The method forms a junction material comprising a p+ polysilicon material overlying the first wiring material. In a specific embodiment, the method includes forming a resistive switching material overlying the junction material and forming an active conductive material overlying the resistive switching material. A masking layer overlies the active conductive material. The method includes subjecting a first stack of material comprising the first wiring material, the junction material, the resistive switching material, and the active conductive material to a first etching process to form a plurality of first structures. Each of the plurality of first structures including the first wiring structure are elongated in shape and separated by a first gap region. The method includes forming a second dielectric material overlying the first structure and filling the first gap region. The second dielectric material is subjected to a first planarizing process to expose a top surface region of the active conductive material. A second wiring material is formed overlying the exposed surface region of the active conductive material and the planarized surface region of the second dielectric material. The method includes subjecting a second stack of material comprising the second wiring material, the plurality of first structures, and the second dielectric material in the first gap region to a second patterning and etching process to form a plurality of second wiring structures and a plurality of resistive switching device. Each of the plurality of second wiring structures is characterized by a second elongated shape and separated by a second gap region. Each of the plurality of resistive switching device comprises at least the active conductive material, the resistive switching material, and the junction material and configured in an intersection of the first wiring structure and the second wiring structure in a specific embodiment.

According to one aspect of the invention, a method of forming non-volatile memory device structure is described. One process includes providing a substrate having a surface region, forming a first dielectric material overlying the surface region of the substrate, and forming a first wiring material overlying the first dielectric material. A method includes forming a junction material comprising a p+ polysilicon material overlying the first wiring material, forming a resistive switching material overlying the junction material, and forming a active conductive material overlying the resistive switching material. A technique includes forming a masking layer overlying the active conductive material, subjecting a first stack of material comprising the first wiring material, the junction material, the resistive switching material, and the active conductive material to a first etching process to form a plurality of first structures, each of the plurality of first structures including a first wiring structure being elongated in shape in a first direction and separated by a first gap region in a second direction, and forming a second dielectric material filling the first gap region and overlying the plurality of first structures. A fabrication recipe includes subjecting the second dielectric material to a first planarizing process to expose a top surface region of the active conductive material and to expose a top surface region of the second dielectric material, forming a second wiring material overlying the top surface region of the active conductive material and the top surface region of the second dielectric material, and subjecting a second stack of material comprising the second wiring material, the plurality of first structures, and the second dielectric material in the first gap region to a second patterning and etching process to form a plurality of second wiring structures and a plurality of resistive switching devices, each of the plurality of second wiring structures being elongated in shape in the second direction and separated by a second gap region in the first direction, each of the plurality of resistive switching devices comprising at least the active conductive material, the resistive switching material, and the junction material, the resistive switching device being configured in an intersection of the first wiring structures and the second wiring structures.

According to another aspect of the invention, a non-volatile memory device structure is disclosed. One device includes a plurality of first wiring structures being elongated in shape in a first direction and separated by a first gap region in a second direction, wherein the first gap region comprises a first dielectric material formed in a first forming process, and a plurality of second wiring structures being elongated in shape in a second direction and separated by a second gap region in a first direction, wherein the second gap region comprises a second dielectric material formed in a second forming process. A device may include a plurality of resistive switching devices comprising at least a layer of active conductive material, a layer of resistive switching material, and a layer of a junction material, wherein each of the plurality of resistive switching devices are formed at intersections of the first wiring structures and the second wiring structures, wherein the junction material comprising a p+ polysilicon material overlying the first wiring material, wherein a first plurality of the plurality of resistive switching devices are separated by the first dielectric material in the first gap region; and wherein a second plurality of the plurality of resistive switching devices are separated by the second dielectric material in the second gap region.

According to yet another aspect of the invention, a non-volatile memory device having a structure formed according to a described process is disclosed. A process may include providing a substrate having a surface region, forming a first dielectric material overlying the surface region of the substrate, foaming a first wiring material overlying the first dielectric material, and forming a junction material comprising a p+ polysilicon material overlying the first wiring material. A method may include forming a resistive switching material overlying the junction material, forming a active conductive material overlying the resistive switching material, forming a masking layer overlying the active conductive material, and subjecting a first stack of material comprising the first wiring material, the junction material, the resistive switching material, and the active conductive material to a first etching process to form a plurality of first structures, each of the plurality of first structures including a first wiring structure being elongated in shape in a first direction and separated by a first gap region in a second direction. A technique may include forming a second dielectric material filling the first gap region and overlying the plurality of first structures, subjecting the second dielectric material to a first planarizing process to expose a top surface region of the active conductive material and to expose a top surface region of the second dielectric material, forming a second wiring material overlying the top surface region of the active conductive material and the top surface region of the second dielectric material, and subjecting a second stack of material comprising the second wiring material, the plurality of first structures, and the second dielectric material in the first gap region to a second patterning and etching process to form a plurality of second wiring structures and a plurality of resistive switching devices, each of the plurality of second wiring structures being elongated in shape in the second direction and separated by a second gap region in the first direction, each of the plurality of resistive switching devices comprising at least the active conductive material, the resistive switching material, and the junction material, the resistive switching device being configured in an intersection of the first wiring structures and the second wiring structures.

Many benefits are achieved by ways of present invention over conventional techniques. For example, embodiments of the present method uses a two step etching process to form a resistive switching device for a non-volatile memory device. The two step etching process allows for device shrinkage without etching a small feature thus improving device performance and device yield. Additionally, the present method utilizes conventional CMOS fabrication equipments without modification. Depending on the embodiment, one or more of these benefits can be achieved. One skilled in the art would recognize other modifications, variations, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is generally related to resistive switching devices. More particularly, embodiments according to the present invention provide a method and a structure to form a resistive switching device. Embodiments according to the present invention can be applied to non-volatile memory devices but it should be recognized that the present invention can have a much broader range of applicability.

Figure 1:
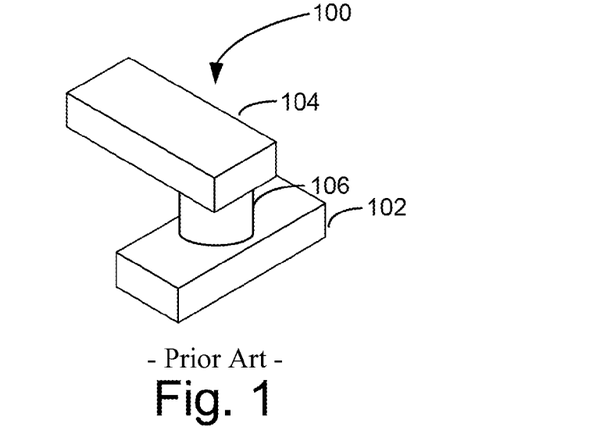
FIG. 1 is a simplified diagram illustrating a resistive switching device.

FIG. 1 is a simplified diagram of a resistive switching device 100. As shown, resistive switching device 100 includes a first electrode 102, a second electrode 104 and a resistive switching element 106 configured in an intersection region between the first electrode and the second electrode. First electrode 102 can be a metal material or a doped semiconductor material used in conventional CMOS processing. For example, the first electrode can be copper, tungsten, aluminum, or a doped semiconductor material.

Resistive switching element can be a suitable insulator material or a semiconductor material characterized by an electrical resistance depending at least on a voltage applied between the first electrode and the second electrode. Conventional fabrication of the resistive switching device includes forming the resistive switching element using a pattering and etching of the resistive switching layer material. As device shrinks, fabrication of the resistive switching element using conventional etching and patterning can be challenging resulting in yield loss and degrading device performance. Accordingly, embodiments according to the present invention Second electrode can include an active conductive material, which forms conductive particles in resistive switching element 106 thereby changing the resistance characteristic upon application of the voltage.

Figure 2:
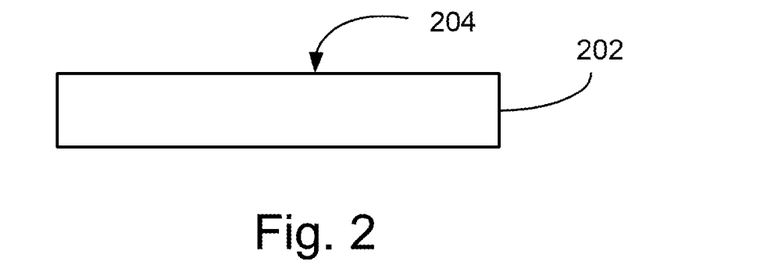
FIG. 2 is a simplified diagram illustrating a process step according to various embodiments.

FIGS. 2-17 are simplified diagrams illustrating a method for forming a resistive switching device for a non-volatile memory device according to an embodiment of the present invention. As shown in FIG. 2, a semiconductor substrate 202 having a surface region 204 is provided. Semiconductor substrate 202 can be a single crystal silicon wafer, a silicon germanium material, a silicon on insulator (commonly called SOI) depending on the embodiment. In certain embodiments, semiconductor substrate 202 can have one or more MOS devices formed thereon. The one or more MOS devices can be controlling circuitry for the resistive switching device in a specific embodiment.

In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 3:
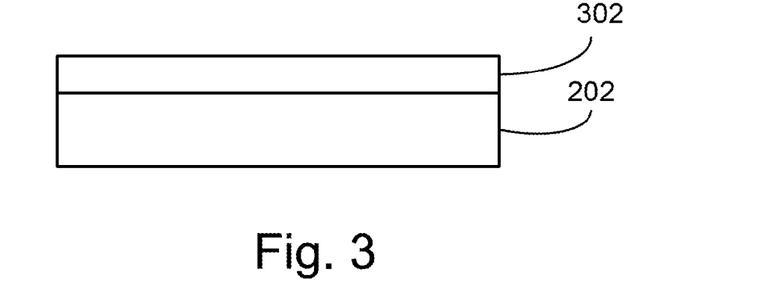
FIG. 3 is a simplified diagram illustrating a process step according to various embodiments.

As illustrated in FIG. 3, the method includes depositing a first dielectric material 302 overlying the semiconductor substrate. First dielectric material 302 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 302 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others Referring to FIG. 4, the method includes depositing a first wiring material 402 overlying the first dielectric material. First wiring material 402 can be a suitable metal material including alloy materials, or a semiconductor material having a suitable conductivity characteristic. The metal material can be tungsten, aluminum, copper or silver, and others. Additionally, the first wiring metal may be a combination of conductive materials. In various embodiments, these metal materials may be deposited using a physical vapor deposition process, chemical vapor deposition process, electroplating, or electrodeless deposition process, including any combinations of these, and others. The semiconductor material can be, for example, a suitably doped silicon material in certain embodiments.

Figure 4:
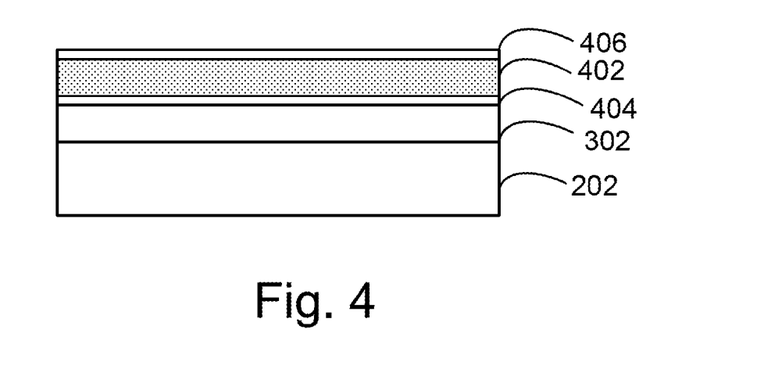
FIG. 4 is a simplified diagram illustrating a process step according to various embodiments.

In certain embodiments, a first adhesion material 404 is first formed overlying the first dielectric material before deposition of the first wiring material to promote adhesion of the first wiring material to the first dielectric material. A diffusion barrier material 406 may also be formed overlying the metal material to prevent the metal material to contaminate other portions of the device in a specific embodiment.

Figure 5:
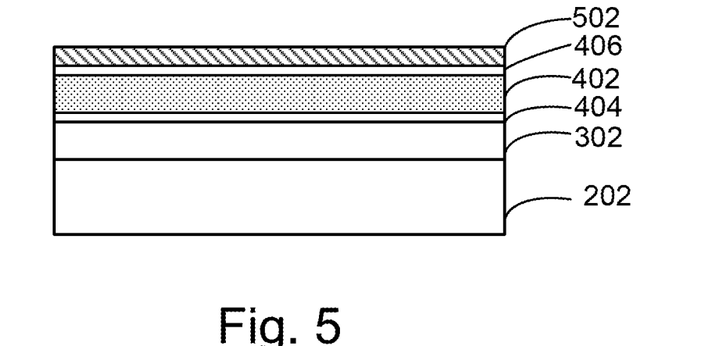
FIG. 5 is a simplified diagram illustrating a process step according to various embodiments.

Referring to FIG. 5, the method includes forming a junction material 502 overlying at least the first wiring material 402 (or first diffusion barrier material 406 if used). First junction material 502 can be a p++ polysilicon material in a specific embodiment. The p++ polysilicon material is can be formed using a deposition process such as a low pressure chemical vapor deposition process a plasma enhanced chemical vapor deposition process using silane ($SiH_4$) or disilane ($Si_2H_6$), or a suitable chlorosilane depending on the application. Alternatively, the first silicon material can be deposited using a physical vapor deposition process from a suitable silicon target. Deposition temperature can range from about 380 Degree Celsius to about 450 Degree Celsius, and sometimes not higher than 440 Degree Celsius. In a specific embodiment, the p++ polysilicon material is deposited using a low pressure chemical vapor deposition process using disilane at a deposition temperature ranging from about 400 Degree Celsius to about 460 Degree Celsius.

Figure 6:
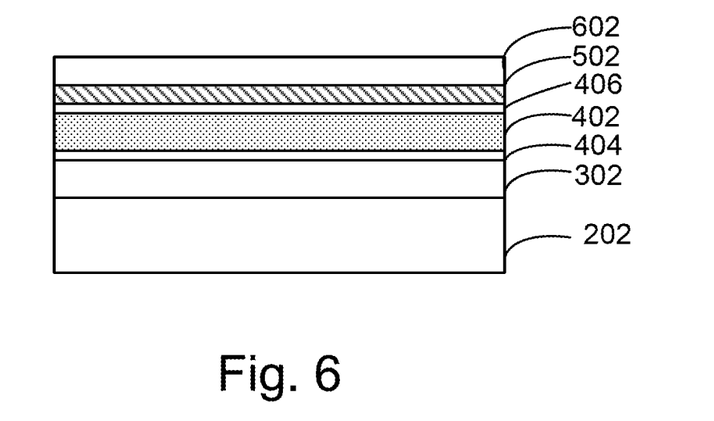
FIG. 6 is a simplified diagram illustrating a process step according to various embodiments.

Referring to FIG. 6, the method deposits a resistive switching material 602 overlying junction material 502. Resistive switching material 602 can be a silicon material. The silicon material can be an amorphous silicon material or a polycrystalline silicon material, and others, depending on the embodiment. In a specific embodiment, resistive switching material 602 comprises an amorphous silicon material. Deposition techniques can include a chemical vapor deposition process CVD), physical vapor deposition (PVD) process, an atomic layer deposition (ALD) process, and others. The chemical vapor process can be a low pressure chemical vapor deposition process, plasma enhanced chemical vapor deposition process, deposited using precursors such as silane, disilane, a suitable chlorosilane in a reducing environment, a combination, and others. Deposition temperature can range from 250 Degree Celsius to about 500 Degree Celsius. In some cases, deposition temperature ranges from about 400 Degree Celsius to about 440 Degree Celsius and no greater than about 450 Degree Celsius.

The switching material is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4) (45 sccm) and Helium (He) (500 sccm) is used to form an a-Si layer with a deposition rate of 80 nm per minute (T=260° C., P=600 mTorr) during PECVD. In another exemplary process, a mixture of silane (SiH4) (190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

Figure 7:
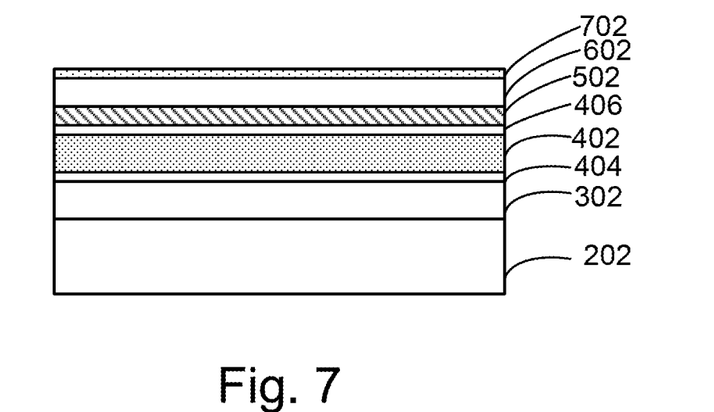
FIG. 7 is a simplified diagram illustrating a process step according to various embodiments.

As shown in FIG. 7, the method includes depositing an active conductive material 702 overlying resistive switching material 602. Active conductive material 702 can be a metal material such as copper, silver, gold, platinum, palladium, nickel, zinc, vanadium, or others. Active conductive material 702 is characterized by a suitable diffusivity in the resistive switching material in a presence of an electric field in a specific embodiment.

For amorphous silicon material as the resistive switching material, the metal material can be silver or an alloy of silver. The alloy of silver comprises at least 80 percent of silver in a specific embodiment. The silver material forms a silver region in a portion of the amorphous silicon material upon application of the electric filed. The silver region comprises a plurality of silver particles, including silver ions, silver clusters, silver atoms and a combination. The plurality of silver particles is formed in defect sites of the amorphous silicon material in a specific embodiment. The silver region further comprises a silver filament structure extending towards the first wiring structure.

In various embodiments, the filament structure is characterized by a length, a distance between the silver particles, and a distance between the filament structure and the first electrode structure. In a specific embodiment, the resistive switching material (for example, the amorphous silicon material) is characterized by a resistance depending at least on a length, a distance between the silver particles, and a distance between the filament structure and the first electrode structure. Due to material mismatch, defect density is high at an interface region formed from the amorphous silicon material and the first wiring material, and may cause a short. The junction layer (for example, p+ polycrystalline silicon germanium material) controls an interfacial defect density for proper switching behavior of the resistive switching device in a specific embodiment.

In some embodiments, the silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

Figure 8:
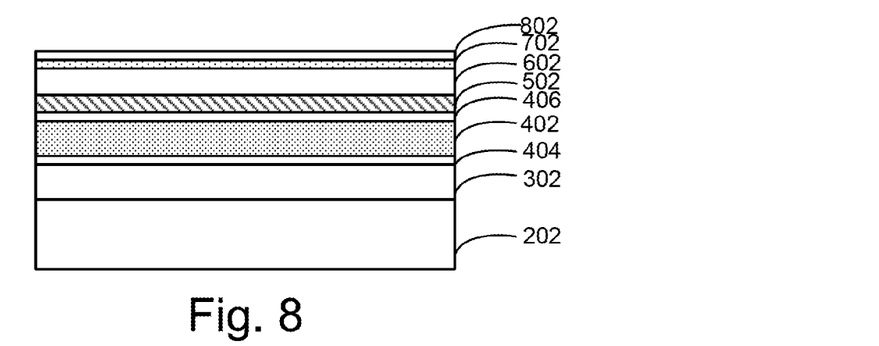
FIG. 8 is a simplified diagram illustrating a process step according to various embodiments.

Depending on the embodiment, a second diffusion barrier material 802 can be formed overlying active conductive material 702. For silver as active conductive material 702, second diffusion barrier material 802 can comprise a titanium/titanium nitride material. Titanium may be formed by a physical vapor deposition process using a titanium target material. Titanium nitride material may be formed using a physical vapor deposition process, or a chemical vapor process or the like.

Figure 9:
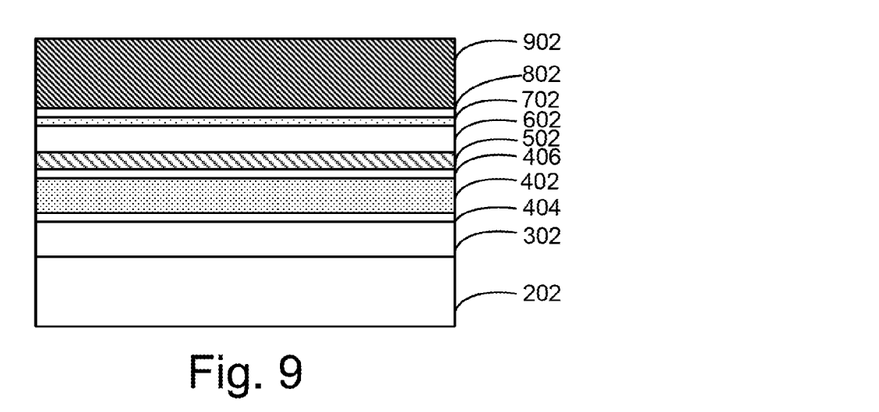
FIGS. 9 and 9A are simplified diagrams illustrating a process step according to various embodiments.
Figure 9A:
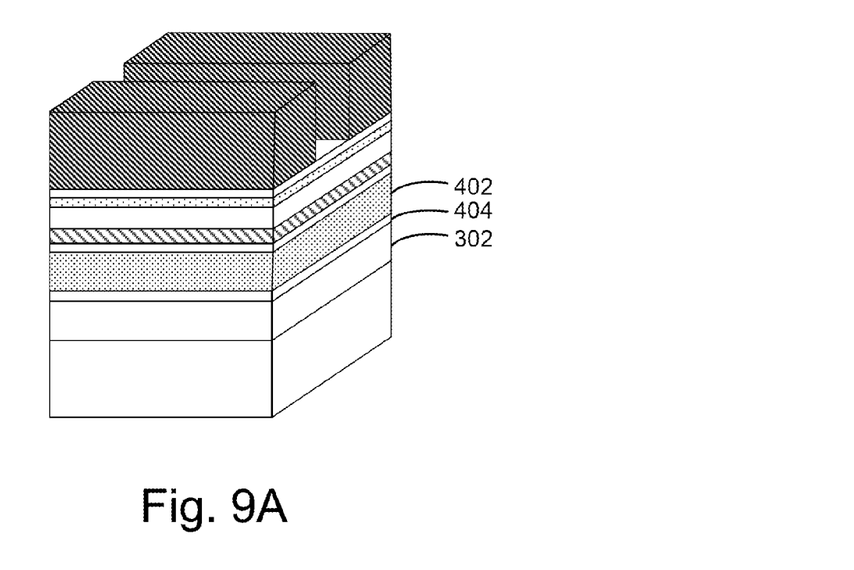

Referring to FIG. 9, the method forms a first masking layer 902 overlying active conductive material 702 (or second diffusion material 802 if used). Masking layer 902 can be formed from a hard mask material, for example, a dielectric material, a metal material, or a semiconductor material depending on the embodiment. Masking layer 902 can be formed by depositing a photoresist material overlying the hard mask material, patterning the photoresist material, and etching the hard mark material. A perspective view is illustrated in FIG. 9A.

Figure 10:
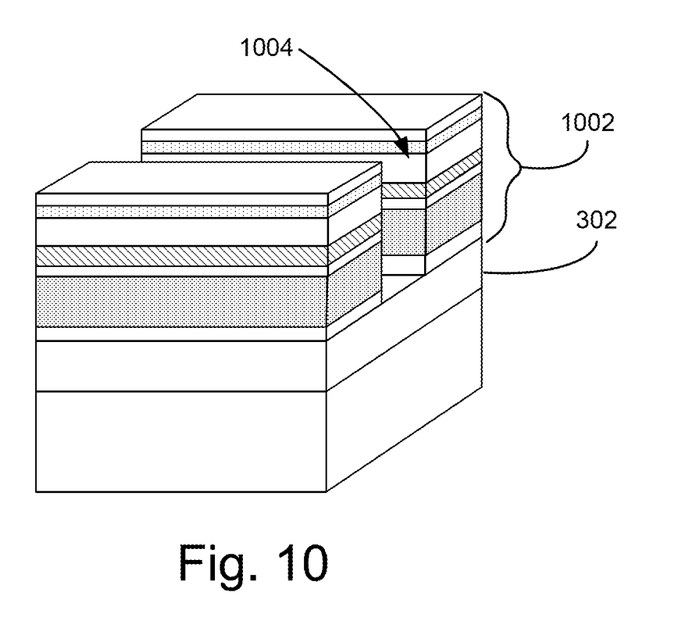
FIG. 10 is a simplified diagram illustrating a process step according to various embodiments.

As shown in FIG. 10, the method subjects a first stack of material comprising at least second diffusion barrier material 802 If used), active conductive material 702, resistive switching material 602, junction material 502, first wiring material 402, (first diffusion barrier material 406, first adhesion material 404 if used) to an etching process to form one or more first structure of material 1002. The first structure of material is elongated in shape and separated by a gap region 1004, as shown. In various embodiments, first dielectric material 302 may stop the etch.

Figure 11:
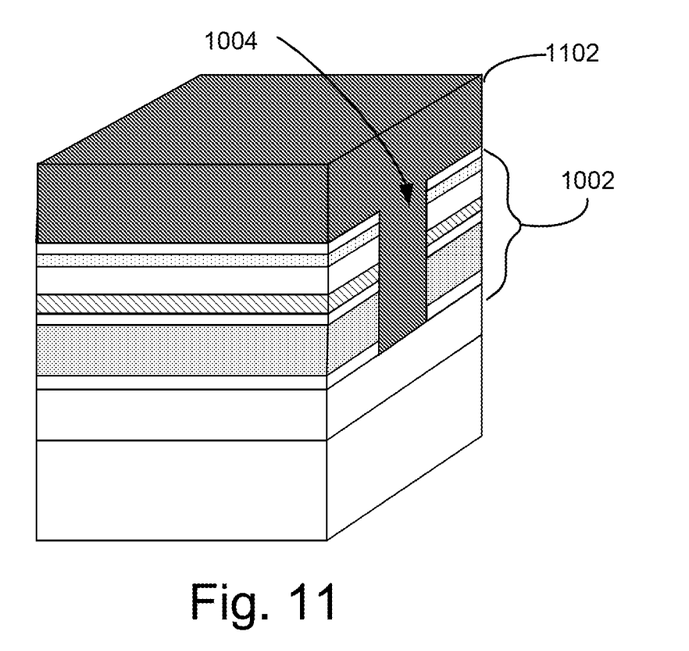
FIG. 11 is a simplified diagram illustrating a process step according to various embodiments.
Figure 12:
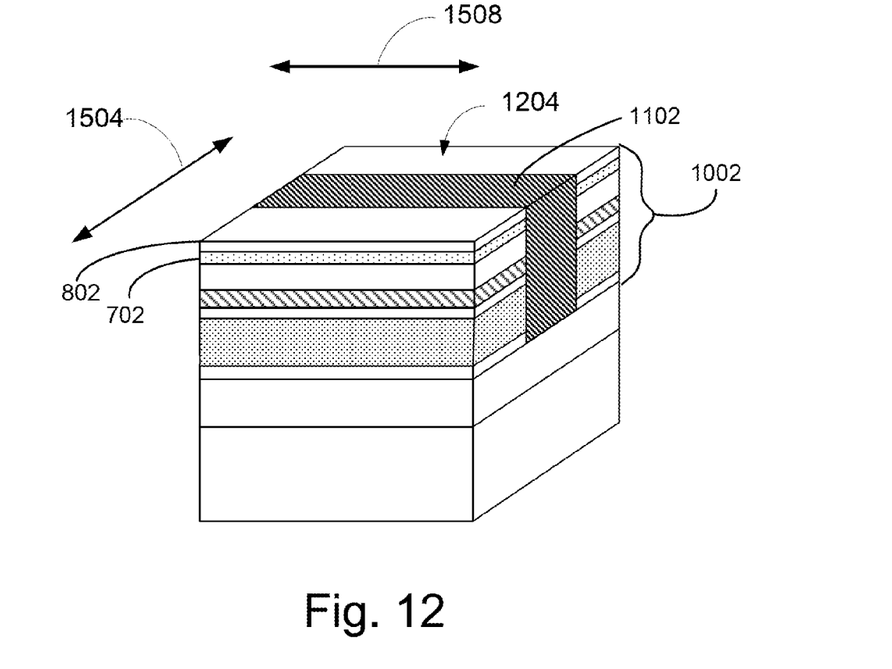
FIG. 12 is a simplified diagram illustrating a process step according to various embodiments.

As illustrated in FIG. 11, a third dielectric material 1102 is formed overlying the at least one first structure of material filling gap region 1004 to isolate each of the one or more first structure 1002 in a specific embodiment. The third dielectric material 1102 can be silicon oxide, silicon nitride, a dielectric stack of alternating layers of silicon oxide and silicon nitride (for example, an ONO stack), a low K dielectric, a high K dielectric, or a combination, and others, depending on the application. Third dielectric material 1102 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others Third dielectric material 1102 is subjected to a planarizing process 1202 to expose a top surface region 1204 of each of the first structure of material 1002 as shown in FIG. 12. Top surface region 1204 comprises a top surface region of active conductive material 702 or diffusion barrier material 802, if used) in a specific embodiment. Planarizing process 1202 can be a chemical mechanical polishing process or an etch back process, or a combination, depending on the embodiment. As illustrated, first structures of material 1002 extend in direction 1508 and are separated by third dielectric material 1102 in gap region 1004 in direction 1504.

Figure 13:
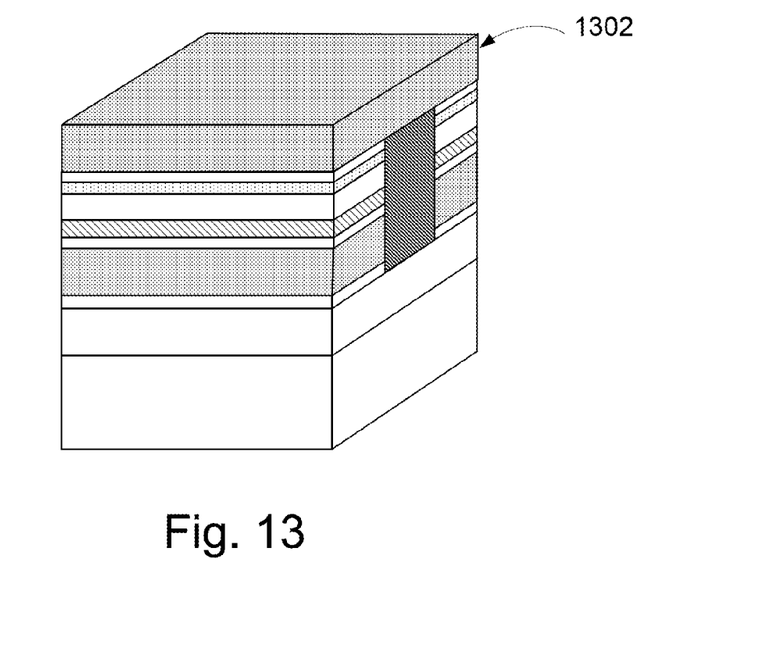
FIG. 13 is a simplified diagram illustrating a process step according to various embodiments.

In a specific embodiment, the method includes forming a second wiring material 1302 overlying top surface region 1204 and third dielectric material 1102. Second wiring material 1302 can include copper, tungsten, aluminum, or a suitable doped semiconductor material depending on the application. Second wiring material can be formed using a physical vapor deposition process, for example a sputtering process from a suitable target material, a chemical vapor deposition process, an electrochemical deposition process including electroless deposition, or any combination of these, and others.

Figure 14:
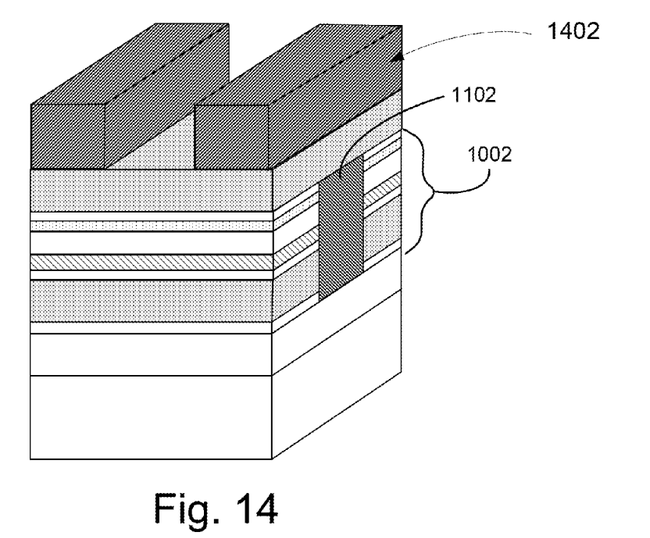
FIG. 14 is a simplified diagram illustrating a process step according to various embodiments.

In a specific embodiment, the method subjects a second stack of material including the second wiring material 1302, the first structure of material 1002, and isolating third dielectric material 1102 to a second patterning and etching process. Second patterning and etching process may include using a second masking layer 1402 as shown in FIG. 14. Second masking layer 1402 can include a hard mask material similar to the first masking layer in certain embodiments. Other masking material may also be used.

Figure 15:
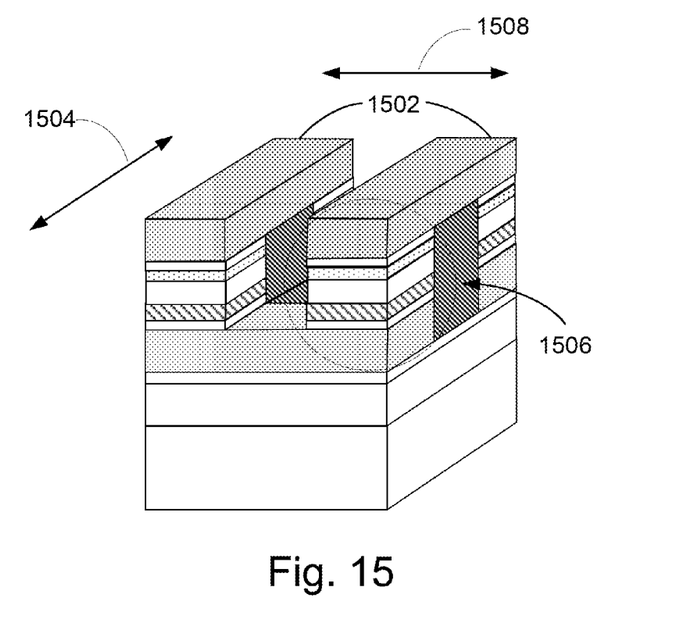
FIG. 15 is a simplified diagram illustrating a process step according to various embodiments.

As shown in FIG. 15, the second patterning and etching process causes formation of a plurality of second wiring structures 1502. As shown, each of the plurality of second wiring structures has an elongated shape and configured to extend in a second direction 1504 in a specific embodiment. The second patterning and etching process and the first patterning and etching process cause formation of a plurality of resistive switching elements. Accordingly, embodiments according to the present invention provide a method of forming isolated resistive switching element structures without forming a high aspect ratio structure.

Figure 16:
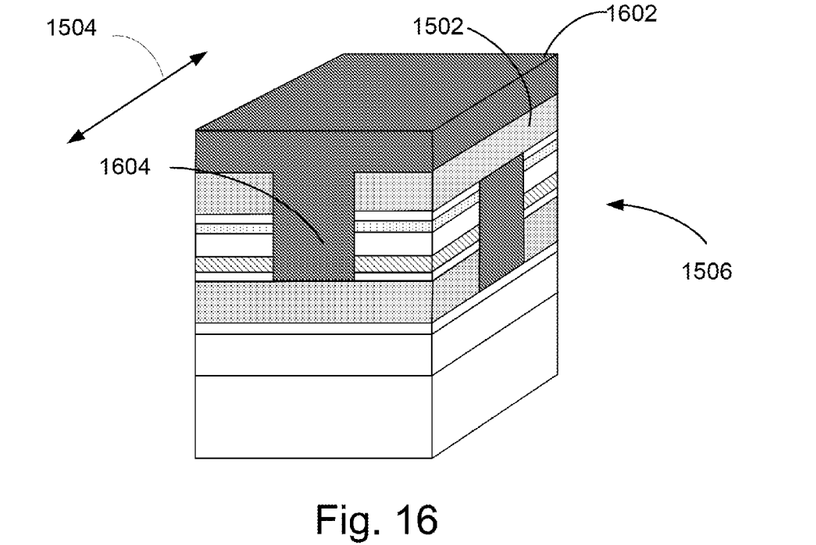
FIG. 16 is a simplified diagram illustrating a process step according to various embodiments.

Referring to FIG. 16, the method includes forming a fourth dielectric material 1602 filling the gaps 1604 between the second wiring structures and to isolate each of the plurality of the resistive switching elements 1506. As illustrated, fourth dielectric material 1602 extends in direction 1504 and separates resistive switching elements 1506 in direction 1508

Figure 17:
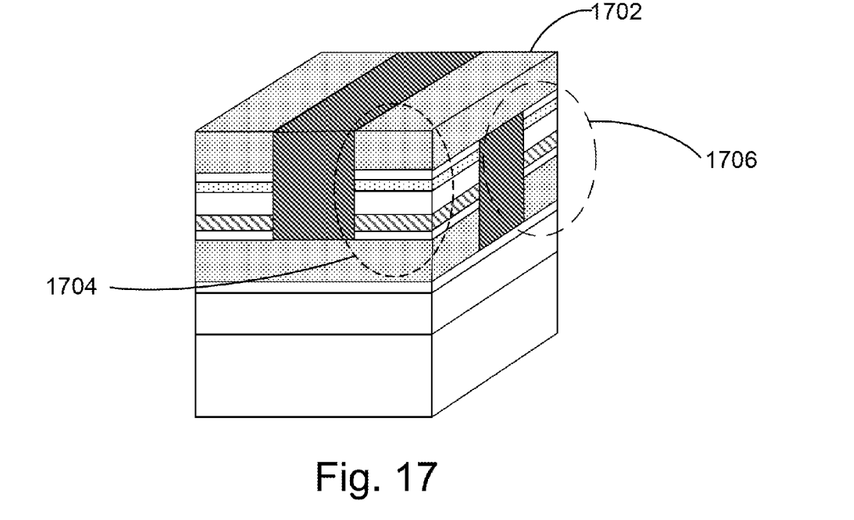
FIG. 17 is a simplified diagram illustrating a process step according to various embodiments.

Various other steps such as planarizing the fourth dielectric material to isolate the second wiring structure as shown in FIG. 17, passivation, and forming global wiring structures are to be included as would be obvious for one skilled in the art. As shown, a resistive switching device 1704 and a resistive switching device (e.g. element) 1706 are illustrated. In various examples, the resistive devices may have a planar cross-section that is approximately: square, rectangular, polygonal in shape, circular, oval or the like (e.g. possible rounded corners). Additionally, they are approximately prismatic in shape, e.g. approximately square prism, approximately rectangle prism, hexagon prism, triangular prism, or the like. Additionally, the first wiring structure and the second wiring structure may be oriented approximately orthogonal, or any other angle, e.g. 60 degrees, 45 degrees, or the like. In such embodiments, the gap regions will also be offset at a similar angle.

Depending on the embodiment, the method can be extended to form N layers of vertically stacked resistive switching devices, where N can range from 1 to 8, or more. The N layers of resistive switching devices are separated and isolated by a dielectric material. For example, the Nth layer of the device is isolated from the (N+1)th layer by the dielectric material.

In a specific embodiment, a resistive switching device structure is provided. The device structure includes a first electrode, a second electrode, and a resistive switching element configured in an intersection region formed from the first electrode and the second electrode. The second electrode can include at least a first portion and a second portion. The first portion can include an active conductive material in physical and electrical contact with the resistive switching element. The resistive element can include a resistive switching material characterized by a resistance modulated by an electric field caused by an electric potential difference between the first electrode and the second electrode. Further, the resistive switching element can be formed by at least a first patterning and etching process and a second patterning and etching process, each of which comprises forming a first gap region and a second gap region to isolate the resistive switching element. The first gap region and the second gap region are configured to be orthogonal to each other in a specific embodiment. The resistive switching device can disposed in a N by M crossbar array wherein each of the crossbar array of memory cells can be further vertically stacked to form a high density memory device in various embodiment.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims

What is claimed is:

1. A method of forming non-volatile memory device structure, comprising:
    providing a substrate having a surface region;
    forming a first dielectric material overlying the surface region of the substrate;
    forming a first wiring material overlying the first dielectric material;
    forming a junction material overlying the first wiring material and comprising one of a p+ polysilicon material and a p++ polysilicon material;
    forming a resistive switching material overlying the junction material;
    forming a active conductive material overlying the resistive switching material;
    forming a masking layer overlying the active conductive material;
    subjecting a first stack of material comprising the first wiring material, the junction material, the resistive switching material, and the active conductive material to a first etching process to form a plurality of first structures, each of the plurality of first structures including a first wiring structure being elongated in shape in a first direction and separated by a first gap region in a second direction;
    forming a second dielectric material filling the first gap region and overlying the plurality of first structures;
    subjecting the second dielectric material to a first planarizing process to expose a top surface region of the active conductive material and to expose a top surface region of the second dielectric material;
    forming a second wiring material overlying the top surface region of the active conductive material and the top surface region of the second dielectric material; and
    subjecting a second stack of material comprising the second wiring material, the plurality of first structures, and the second dielectric material in the first gap region to a second patterning and etching process to form a plurality of second wiring structures and a plurality of resistive switching devices, each of the plurality of second wiring structures being elongated in shape in the second direction and separated by a second gap region in the first direction, each of the plurality of resistive switching devices comprising at least the active conductive material, the resistive switching material, and the junction material, the resistive switching device being configured in an intersection of the first wiring structures and the second wiring structures.

2. The method of claim 1 further comprises forming a third dielectric material overlying the second wiring structure and filling the second gap region.

3. The method of claim 2 wherein the plurality of resistive switching devices are separated by the second dielectric material in the first gap region or the third dielectric material in the second gap region.

4. The method of claim 2 further comprises subjecting the third dielectric material to a second planarizing process to expose a surface region of each of the plurality of the second wiring structures.

5. The method of claim 1 wherein the first wiring structure is configured to spatially extend in the first direction and the second wiring structure is configured to spatially extend in the second direction, wherein the second direction is orthogonal to the first direction.

6. The method of claim 1 wherein the resistive switching material comprises an amorphous silicon material, the amorphous silicon material is not doped intentionally.

7. The method of claim 1 wherein the active conductive material comprises a metal material selected from a group consisting of: silver, platinum, palladium, gold, nickel, aluminum, copper, vanadium, and chromium.

8. The method of claim 1 wherein the first dielectric material and the second dielectric material are selected from a group consisting of: silicon oxide, silicon nitride, a dielectric stack comprising alternating layers of silicon oxide and silicon nitride, a high K dielectric material, and a low K dielectric material.

9. The method of claim 1 wherein the plurality of resistive switching devices are associated with a geometric volume selected from a group consisting of: an approximately square prism, an approximately rectangular prism.

* * * * *